United States Patent [19]
Kadosh et al.

[11] Patent Number: 6,069,398
[45] Date of Patent: May 30, 2000

[54] THIN FILM RESISTOR AND FABRICATION METHOD THEREOF

[75] Inventors: Daniel Kadosh, Austin; Mark I. Gardner, Cedar Creek; Frederick N. Hause, Austin, all of Tex.

[73] Assignee: Advanced Micro Devices, Inc., Sunnyvale, Calif.

[21] Appl. No.: 08/905,306

[22] Filed: Aug. 1, 1997

[51] Int. Cl.[7] .................................................. H01L 29/00
[52] U.S. Cl. ........................ 257/538; 257/536; 438/382
[58] Field of Search ..................... 257/536, 538, 257/540–543; 438/152–154

[56] References Cited

U.S. PATENT DOCUMENTS

| | | | |
|---|---|---|---|
| 3,906,255 | 9/1975 | Mensch, Jr. .............................. | 257/538 |
| 4,426,658 | 1/1984 | Gontowski, Jr. ....................... | 257/538 |
| 4,902,637 | 2/1990 | Kondou et al. ......................... | 437/51 |
| 4,916,507 | 4/1990 | Boudou et al. ......................... | 257/538 |
| 4,939,568 | 7/1990 | Kato et al. . | |
| 5,079,670 | 1/1992 | Tigelaar et al. . | |
| 5,128,745 | 7/1992 | Takasu et al. .......................... | 257/538 |
| 5,275,963 | 1/1994 | Cederbaum et al. ................... | 437/48 |
| 5,426,072 | 6/1995 | Finnila . | |
| 5,661,325 | 8/1997 | Hayashi et al. ........................ | 257/904 |
| 5,683,939 | 11/1997 | Schrantz et al. ....................... | 437/195 |
| 5,726,474 | 3/1998 | Miller et al. ........................... | 257/364 |
| 5,751,050 | 5/1998 | Ishikawa et al. ....................... | 257/538 |
| 5,838,044 | 11/1998 | Chang et al. ........................... | 257/369 |
| 5,841,160 | 11/1998 | Nakamura . | |
| 5,869,859 | 2/1999 | Hanagasaki . | |
| 5,869,861 | 2/1999 | Chen . | |
| 5,972,788 | 10/1999 | Ryan et al. ............................. | 438/634 |

FOREIGN PATENT DOCUMENTS

| | | |
|---|---|---|
| 58-43554 | 3/1983 | Japan . |
| 63-211672 | 9/1988 | Japan . |
| 2-140981 | 11/1988 | Japan . |
| 2-275667 | 4/1989 | Japan . |
| WO 98/35385 | 8/1998 | WIPO . |

OTHER PUBLICATIONS

IBM Technical BUlletin, High Capacitance Tungsten to metal 1 capacitor for high frequency applications, vol. 38, No. 02, Feb. 1995.

*Primary Examiner*—Tom Thomas
*Assistant Examiner*—Ori Nadav
*Attorney, Agent, or Firm*—Skjerven, Morrill, MacPherson, Franklin, & Friel, LLP.; Ken J. Koestner

[57] ABSTRACT

A resistor is formed between devices in an integrated circuit by forming a patterned trench in an intralayer dielectric (ILD) deposited over the devices, filling the trench with polysilicon and planarizing the polysilicon. The resistance of the resistor is defined by determining and selecting the size and form of the trench including the width, length, depth and orientation of the trench. In some embodiments, the resistance of the resistor is also controlled by adding selected amounts and species of dopants to the polysilicon. In some embodiments, the resistance is controlled by directly saliciding the polysilicon in the trench.

19 Claims, 9 Drawing Sheets

THIN FILM RESISTOR AND FABRICATION METHOD THEREOF

BACKGROUND OF THE INVENTION

1. Field of the Invention

The present invention relates to an integrated circuit and fabrication method. More specifically, the present invention relates to an integrated circuit including a thin film resistor constructed in a plane elevated with respect to a device plane.

2. Description of the Related Art

Typically resistors in integrated circuits are formed through a sequence including oxidation, masking, and doping steps in which a pattern is opened in a layer of oxide on a substrate surface. Resistors are often formed in the shape of dumbbells with square ends serving as contact regions with a long, thin region within which supplies resistance. The resistance of the interior long, thin region is determined from the sheet resistance of the region and the number of squares contained in the region. The number of squares is determined by dividing the length of the region by the width.

Following doping and reoxidation, contact holes are etched in the square ends to contact the resistor into the circuit. A resistor is a two-contact, no-junction device so that current flows between contacts without crossing an N-P or P-N junction.

Resistors that are doped by ion implantation have more controlled values than resistors that are formed in diffused regions. Doped resistors can be formed during any of the doping steps in a fabrication process. For example, in MOS circuits resistors are generally formed during a source-drain doping step so that the resistor has the same doping parameters, such as sheet resistance, depth and dopant quality, as the doped device. Unfortunately, since the dopants and dosages applied to form resistors are limited by the device doping parameters, the resistances that can be achieved are similarly limited.

In addition, resistors are typically space-intensive so that the formation of resistors and the resistance values of the resistors are limited by the surface area of the substrate.

What is needed is a resistor structure and technique for manufacturing resistors that supply a wide range of resistance values and improved precision for setting resistances.

SUMMARY

A resistor is formed between devices in an integrated circuit by forming a patterned trench in an intralayer dielectric (ILD) deposited over the devices, filling the trench with polysilicon and planarizing the polysilicon. The resistance of the resistor is defined by determining and selecting the size and form of the trench including the width, length, depth and orientation of the trench. In some embodiments, the resistance of the resistor is also controlled by adding selected amounts and species of dopants to the polysilicon. In some embodiments, the resistance is controlled by directly saliciding the polysilicon in the trench.

In accordance with an embodiment of the present invention, a method of fabricating an integrated circuit includes forming a transistor including a gate formed on a substrate over a gate oxide layer and a source region and a drain region doped into the substrate self-aligned with respect to the gate. The transistor is formed on the substrate to define a transistor plane. The method further includes forming an intralayer dielectric (ILD) layer overlying the substrate and the transistor, etching a resistor trench into the ILD layer, and forming a polysilicon resistor in the resistor trench. The polysilicon resistor is formed in a resistor plane which is elevated with respect to the transistor plane. The method further includes cutting a via through the ILD layer and the gate oxide layer to the substrate surface the source region or the drain region of the transistor, and forming a conductive plug in the via. The conductive plug electrically connects to the source region or the drain region of the transistor and electrically connects to the polysilicon resistor.

In accordance with another embodiment of the present invention, an integrated circuit includes a substrate wafer and a transistor formed upon and within a portion of the substrate wafer. The transistor further includes a gate formed on the substrate over a gate oxide layer and a source region and a drain region doped into the substrate self-aligned with respect to the gate. The transistor being formed on the substrate to define a transistor plane. The integrated circuit further includes an intralayer dielectric (ILD) layer connected to and overlying the substrate and the transistor, a polysilicon resistor connected to and overlying at least a portion of the ILD layer on a resistor plane which is elevated with respect to the transistor plane, a via passing through the ILD layer and the gate oxide layer to the substrate surface and connected to the source region or the drain region of the transistor, and a conductive plug contained within the via. The conductive plug electrically couples to the source region or the drain region of the transistor and electrically couples to the polysilicon resistor.

Many advantages are gained by the described integrated circuit and corresponding fabrication method. The polysilicon resistors are formed separately from the doping of transistor regions so that dopant species and dosages are advantageously selected to precisely control the resistance values of the fabricated resistors rather than to comply with doping parameters for forming other devices in the manner of conventional transistor formation. As a result, the operating parameters for both the devices and resistors are improved and the range of resistances that are achieved is enlarged.

The formation of a polysilicon resistor in an elevated plane overlying a transistor layer advantageously allows resistors to be more closely packed, increasing the number of resistors and the range of resistances that can be fabricated. The polysilicon resistor is polished to advantageously form a highly planar structure that is beneficial in integrated circuits having multiple metal layers.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings.

DETAILED DESCRIPTION OF THE ILLUSTRATIVE EMBODIMENTS

Figure 1A:
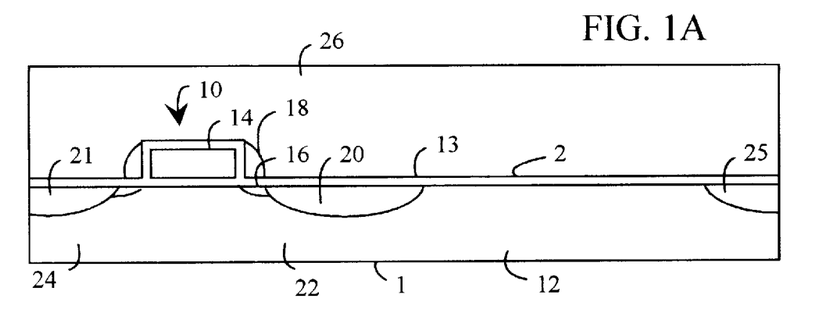
FIGS. 1A through 1C depict a sequence of schematic cross-sectional views that portray a summary of an embodiment of a fabrication process for forming an integrated circuit including a thin-film resistor in accordance with an aspect of the present invention.

FIG. 1A depicts a portion of a semiconductor wafer 1 showing a cross-sectional view of a MOSFET 10 formed on a transistor layer 2 of a substrate 12. In an illustrative embodiment, the MOSFET 10 is formed using lightly-doped drain (LDD) fabrication techniques including formation of a gate oxide layer 13 overlying the substrate 12, formation of a polysilicon gate 14, and implant of LDD regions 16 in the substrate 12 self-aligned with the polysilicon gate 14. Silicon nitride or silicon dioxide spacers 18 are formed lateral to the polysilicon gate 14.

Following formation of the spacers 18, a heavily-doped drain implant 20 is implanted on a drain side 22 of the MOSFET 10. A source side 24 of the MOSFET 10 may be implanted with a heavily-doped source implant 21. An intralayer dielectric (ILD) layer of silicon dioxide 26 is deposited over the substrate 12 and the polysilicon gate 14 and spacers 18 to electrically isolate devices formed on the substrate 12. The ILD layer of silicon dioxide 26 is deposited in a thick layer, for example in a range from approximately 1000 Å to about 25000 Å and planarized. The ILD layer of silicon dioxide 26 mutually isolates devices on the surface of the substrate 12 and isolates the devices from overlying conductive layers that are subsequently formed.

A heavily-doped implant 25 of an adjacent device, such as a transistor, is formed nearby the MOSFET 10.

Figure 1B:
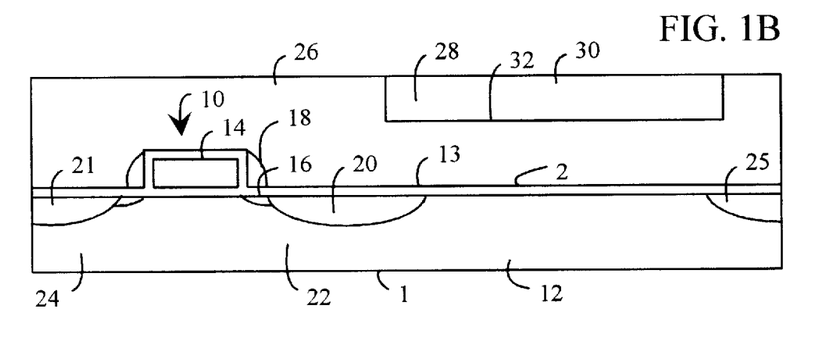

Referring to FIG. 1B, a patterned trench 28 is formed in the ILD layer of silicon dioxide 26. The patterned trench 28 is formed by depositing a photoresist trench mask pattern (not shown) overlying the ILD layer of silicon dioxide 26. The size, shape and configuration of the photoresist trench mask pattern in defined to attain a selected resistance for each resistor structure that is subsequently fabricated in the ILD layer of silicon dioxide 26. The photoresist trench mask pattern is formed, the ILD layer of silicon dioxide 26 is etched, and the photoresist trench mask pattern is stripped, leaving the patterned trench 28 as a formed depression in the ILD layer of silicon dioxide 26. The width, length, depth, and orientation of the trench are precisely controlled by controlling the pattern shape, size and configuration and by controlling the etching depth to fabricate resistors with a precisely controlled resistance.

A polysilicon resistor 30 is formed within the patterned trench 28 by depositing a polysilicon layer (not shown) over the entire surface of the semiconductor wafer 1 and planarizing the polysilicon by a chemical-mechanical polishing (CMP) process so that the polysilicon is removed in regions other than the patterned trench 28. The polishing process is highly advantageous for forming a highly planar structure that is beneficial in integrated circuits having multiple metal layers. The planarized polysilicon forms a second-layer substrate formation 32, an essentially planar resistor structure that is elevated from the transistor layer 2 of the semiconductor wafer 1. The formation of a polysilicon resistor 30 in an elevated plane of the second-layer substrate formation 32 overlying the transistor layer 2 advantageously allows resistors to be more closely packed, increasing the number of resistors and the range of resistances that can be fabricated.

In some embodiments, the polysilicon resistor 30 is salicided directly to supply a desired resistance value. In other embodiments, the polysilicon resistor 30 is doped with either N-type dopants or P-type dopants to select the value of resistance. Typically the second-layer substrate formation 32 is doped by either an implant operation or by doping during deposition. Advantageously, the dopant species and dosages are selected to precisely control the resistance values of the fabricated resistors rather than to comply with doping parameters for forming other devices in the manner of conventional transistor formation. As a result, the operating parameters for both the devices and resistors are improved and the range of resistances that are achieved is enlarged.

Figure 1C:
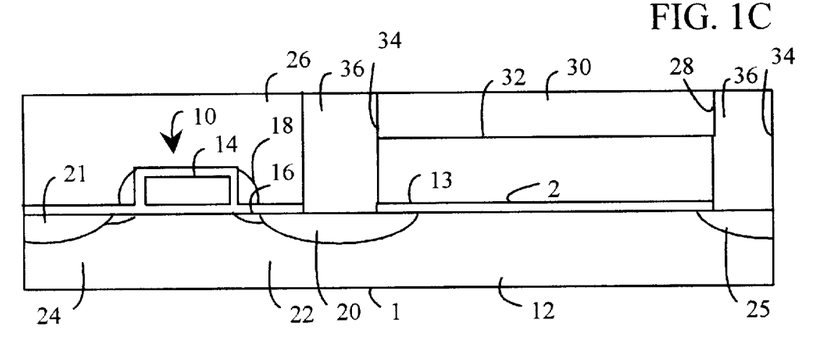

Referring to FIG. 1C, a contact via 34 is formed through the ILD layer of silicon dioxide 26 directly adjacent to the polysilicon resistor 30 and extending through the ILD layer of silicon dioxide 26 to suitable source/drain regions of devices on the surface of the substrate 12. For example, the contact via 34 is shown passing through the ILD layer of silicon dioxide 26 and through the gate oxide layer 13 to form an ohmic connection to the source implant 21. The contact via 34 is formed using a contact mask (not shown) which is patterned and etched to form the contact via 34. Vias are formed to expose source and drain regions of the transistors and devices on the surface of the substrate 12. The contact via 34 intersects the polysilicon resistor 30 structure of the second-layer substrate formation 32.

Similarly, a contact via 34 is formed for accessing the heavily-doped region 25 of a nearby device.

A metal plug 36 is formed inside the contact via 34 to serve as a local interconnect structure, electrically connecting the MOSFET 10 to the polysilicon resistor 30. The metal plug 36 is formed following formation of the polysilicon resistor 30 by depositing a layer of metal overlying the entire surface of the semiconductor wafer 1 to form a local interconnect of metal plugs. The metal plugs are filled into the contact vias to form source and drain connections to the transistors and connecting the transistors to the resistors on the second-layer polysilicon. The metal plugs are typically constructed from titanium (Ti), tungsten (W), titanium nitride (TiN), aluminum (Al), or other common metals.

The contact via 34 for accessing the heavily-doped region 25 is similarly filled with a metal plug 36 and electrically connecting the polysilicon resistor 30 between the MOSFET 10 and the device.

Excess metal is removed, typically either by metal polishing or etching. In some embodiments of a fabrication process, the metal layer is polished using a chemical-mechanical polishing technique to a level substantially even with the surface of the ILD layer and second-layer polysilicon substrate. In other embodiments, the metal local interconnect layer is etched to localize metal plugs and lines to selected areas and configurations.

Figure 2A:
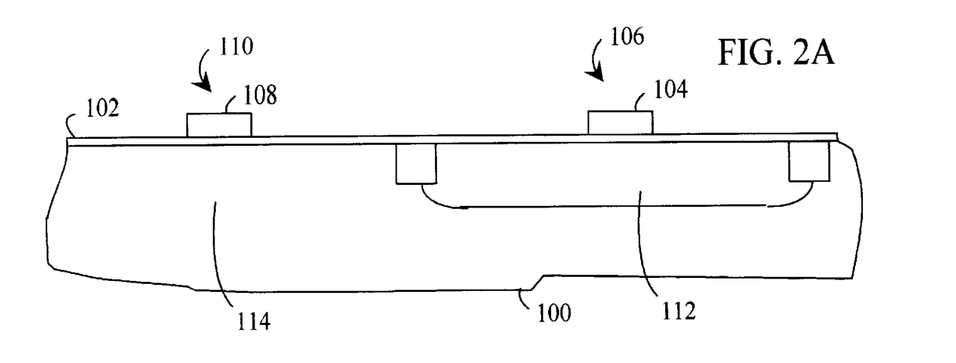
FIGS. 2A through 2J depict a sequence of schematic cross-sectional views of a silicon wafer during processing for forming an integrated circuit including a thin-film resistor.

Referring to FIGS. 2A through 2J, a series of schematic cross-sectional views of a silicon wafer 100 illustrate a more detailed view of processing for forming an integrated circuit including thin film resistors. Referring to FIG. 2A, an exemplary embodiment is shown in which NMOS devices in an N-well technology are formed in a lightly doped P-substrate having a P-type impurity concentration of greater than approximately $10^{15}/cm^3$ and PMOS devices are formed in a more heavily-doped N-type substrate having an impurity concentration of less than $10^{16}/cm^3$. The starting material is typically a heavily-doped <100>-orientation silicon substrate having a quality suitable for integrated circuit manufacture. A thin (5 $\mu$m to 10 $\mu$m) lightly-doped epitaxial layer is grown on the silicon substrate. The illustrative epitaxial layer is a P-type epitaxial surface layer with a <100> orientation and a resistivity of 12 ohm-cm. Either an n-epi-on-n$^+$ or a p-epi-on-p$^+$ substrate may be used for the epitaxial layer. The p-epi-on-p$^+$ substrate is more typically used due to a lesser sensitivity to process-induced defects. The silicon substrate and the epitaxial layer in combination form a silicon wafer 100.

Ions are implanted into the silicon wafer 100 to adjust a threshold voltage $V_T$. In embodiments including a P-layer, an N-layer, or both a P-layer and an N-layer, the threshold voltage $V_T$ is adjusted by ion implantation for both enhancement mode and depletion mode transistors. Ion implantation is used to set threshold voltage $V_T$, advantageously allowing the threshold voltage $V_T$ to be set independently of substrate doping, allowing substrate doping to be set on the basis of device performance alone. Adjustment of threshold voltage $V_T$ is achieved by implanting impurities such as boron, phosphorus, or arsenic ions into regions beneath the gate oxide of a MOSFET. Boron atoms positively shift threshold voltage $V_T$. Phosphorus or arsenic atoms negatively shift threshold voltage $V_T$. The threshold voltage $V_T$ adjustment implant is performed either with a single boron implant or separate p-type and n-type implants using additional masking steps.

In the illustrative embodiment, threshold adjustment implants and punchthrough implants are implanted prior to growth of a gate-oxide layer on the silicon wafer 100 surface. In various embodiments, threshold adjustment implants and punchthrough implants may be performed either before or after formation of a trench or before or after gate-oxide growth. In conventional devices, the threshold voltage $V_T$ adjustment implant is injected through the gate oxide layer to limit depth of the boron threshold adjustment implant to a shallow depth. A suitable threshold voltage $V_T$-adjust implant energy forms an implant with a peak concentration at the oxide-silicon interface. A subsequent implant-activating anneal operation distributes the implanted ions more broadly than the implanted profile.

In an illustrative embodiment, a threshold voltage $V_T$ adjustment implant for enhancement-mode devices is performed. For example, boron is implanted at a concentration in a range from approximately $10^{12}$ to $10^{13}$ atoms/cm$^2$ and an energy in the range from about 10 keV to 100 keV, an energy insufficient to penetrate a trench or field oxide isolation (not shown). The $V_T$ adjustment implant for enhancement-mode devices is typically performed without masking.

A threshold voltage $V_T$ adjustment implant for depletion-mode devices is performed by implanting areas of depletion-mode devices with phosphorus or arsenic atoms at a concentration of about $10^{12}$ atoms/cm$^2$ and an implant energy in the range of about 100 keV. The implant dosage is adjusted to overcompensate for the boron threshold voltage $V_T$ adjustment implant for enhancement-mode devices. The depletion-mode implant is performed with a photoresist mask to selectively locate the depletion-mode transistor channels.

A layer of silicon dioxide with a thickness in the range of 30 Å to 150 Å forms a gate oxide layer 102 on the top surface of the silicon wafer 100 by tube growth at a temperature of 700° C. to 1000° C. in an $O_2$ ambient.

In the illustrative embodiment, a polysilicon gate 104 for a P-channel transistor 106 and a polysilicon gate 108 for an N-channel transistor 110 are formed by depositing a layer of undoped polysiticon to a thickness of approximately 2000 Å by low pressure chemical vapor deposition (LPCVD) over the gate oxide layer 102. The polysilicon is doped using a technique selected from among several suitable techniques including doping in situ during deposition and doping prior to etching by implanting arsenic atoms with a dosage in a range from $1\times10^{15}$ to $5\times10^{16}$ atoms/cm$^2$ and an energy in a range from 2 to 50 kiloelectron-volts (keV). In another example, polysilicon is doped in a subsequent process step during introduction of dopant into the silicon wafer 100. The polysilicon gates 104 and 108 are formed by depositing a photoresist mask (not shown) in a continuous layer over the polysilicon layer and irradiating the photoresist mask using a photolithographic system. The photolithographic system projects I-line ultraviolet light from a mercury-vapor lamp through a reticle and a focusing lens to form a predetermined image pattern on the photoresist mask. The photoresist mask is developed and irradiated portions are removed to form openings in the mask. An anisotropic dry etch etches the polysilicon layer to form the polysilicon gates 104 and 108 with substantially vertical side walls using an etching process that is highly selective of polysilicon. A reactive ion etch (RIE) removes the regions of gate oxide layer 102 except for portions underlying the polysilicon gates 104 and 108. The photoresist mask is stripped.

The polysilicon gate 104 of the P-channel transistor 106 overlies a region of N-doped substrate 112, such as an N-well. The polysilicon gate 108 of the N-channel transistor 110 overlies a region of P-doped substrate 114.

Figure 2B:
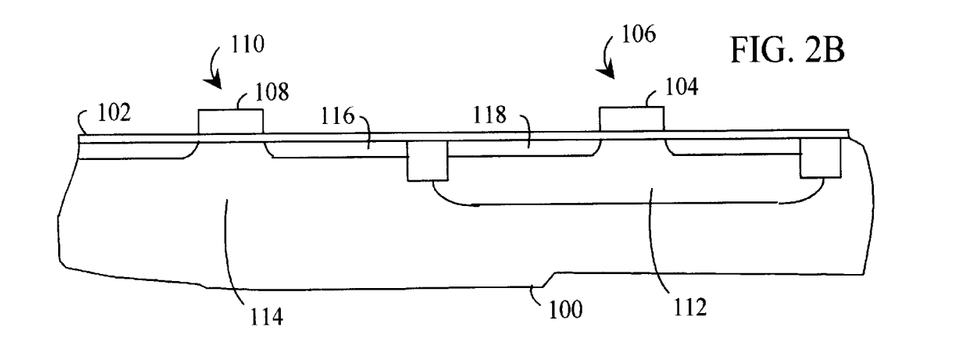

Referring to FIG. 2B, a first masking step and a first ion implant step form a N$^-$ LDD implant and include applying a lightly-doped drain (LDD) mask to the silicon wafer 100 and implanting N$^-$ ions to form N-channel transistor LDD regions 116 which are self-aligned with the polysilicon gate 108. The N$^-$ ion implantation process includes implanting arsenic at a dosage in the range of $1\times10^{13}$ to $5\times10^{14}$ atoms/cm$^2$ and an energy in the range of 2 to 50 keV, using the polysilicon gate 108 as an implant mask. A second masking step and a second ion implant step form a P$^-$ LDD implant and include applying a lightly-doped drain (LDD) mask to the silicon wafer 100 and implanting P$^-$ ions to form P-channel transistor LDD regions 118 which are self-aligned with the polysilicon gate 104. The P$^-$ ion implantation process includes implanting boron or BF$_2$ at a dosage in the range of $1\times10^{13}$ to $5\times10^{14}$ atoms/cm$^2$ and an energy in the range of 2 to 50 keV, using the polysilicon gate 104 as an implant mask. The implant energy for a boron implant is typically much lower than the implant energy for the BF$_2$ since boron atoms are very light and implant too deeply at high energies.

Figure 2C:
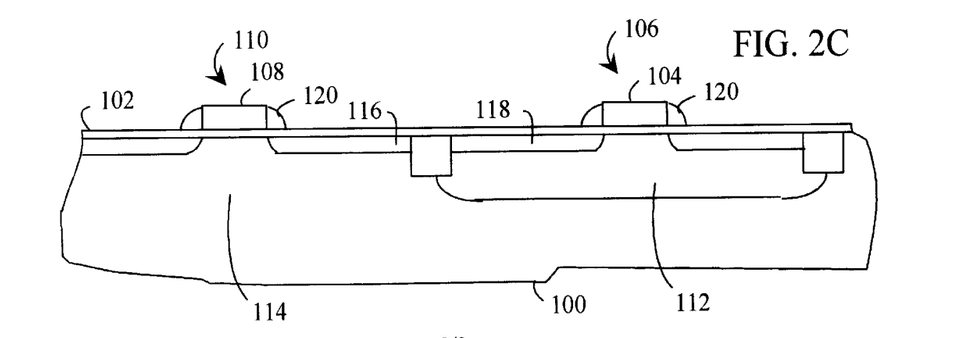

Referring to FIG. 2C, silicon nitride or silicon dioxide spacers 120 are formed on the substantially vertical side walls of the P-channel polysilicon gate 104 and the N-channel polysilicon gate 108. In one embodiment, silicon nitride spacers 120 are formed by chemical vapor deposition of a silicon nitride ($Si_3N_4$) film overlying the silicon wafer 100 and polysilicon gates 104 and 108. Silicon nitride films are amorphous insulating materials that serve as passivation and mechanical protective layers for integrated circuits. Silicon nitride films are suitable for usage as a passivation layer by acting as a nearly impervious barrier to diffusion, particularly diffusion of moisture and sodium.

A silicon nitride film is deposited using several techniques. In one technique, silicon nitride is deposited by high-temperature (700° C. to 800° C.) low pressure chemical vapor deposition (LPCVD) to produce a silicon nitride film with good uniformity. In a second technique, silicon nitride is deposited by a low temperature (200° C. to 400° C.) plasma-enhanced chemical vapor deposition (PECVD) that is compatible with low-meltingpoint metals such as aluminum. The silicon nitride layer is conformally deposited to a thickness in a range from 600 Å to 2000 Å and etched using a reactive ion etch (RIE) procedure that forms the spacers 120 adjacent to the edges of the polysilicon gates 104 and 108.

In the illustrative embodiment, the spacers 120 are formed directly in contact with the polysilicon gates 104 and 108 and directly in contact with the silicon wafer 100. In alternative embodiments, the spacers 120 may be formed separated from the polysilicon gates 104 and 108 by a thin oxide layer and separated from the silicon wafer 100 by a thin oxide layer.

The form of the P-channel transistor LDD regions 118 and the N-channel transistor LDD regions 116 determines the hot carrier performance of the transistors and is established by the profile of the spacers 120. For embodiments utilizing silicon nitride spacers 120, the spacer profile varies as a function of the spacer nitride etch time and the spacer nitride thickness. A suitable amount of over-etch is used to form the silicon nitride spacers 120. However, excessive over-etching reduces the width and height of the silicon nitride spacers 120 and causes gouging into the silicon of the silicon wafer 100. Control of the over-etch process becomes more difficult as the deposited spacer nitride layer thickness increases.

In alternative embodiments, materials other than silicon nitride may be employed as spacers on the gate electrodes. Advantages are gained by using a spacer material that is resistant to processes for etching a silicon dioxide (oxide) layer.

Figure 2D:
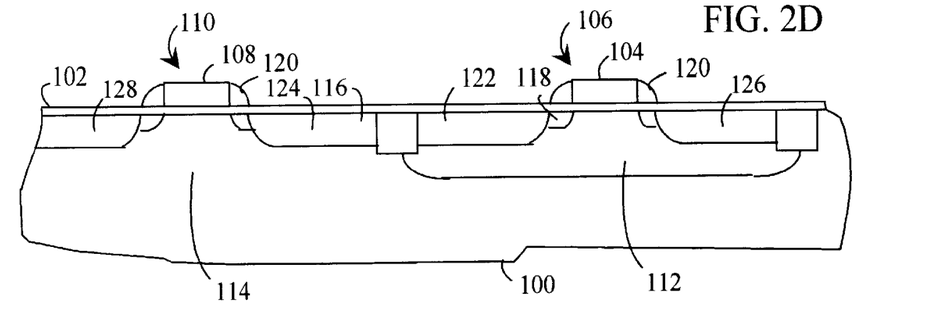

Referring to FIG. 2D, heavily doped drain regions including a P-channel drain region 122 and an N-channel drain region 124 and heavily doped source regions including a P-channel source region 126 and an N-channel source region 128 are implanted into the silicon wafer 100 by applying separate mask and implant processes for the P-channel transistor 106 and the N-channel transistor 110. The heavily-doped P-channel drain region 122 and heavily-doped P-channel source region 126 are implanted by injecting boron atoms or $BF_2$ molecules into a portion of the surface of the silicon wafer 100 that is self-aligned with the polysilicon gate 104 and the silicon nitride spacer 120 on the drain side and source side of the P-channel transistor 106, respectively. The boron atoms or $BF_2$ molecules are implanted at a dosage in the range of $1\times10^{15}$ to $5\times10^{15}$ atoms/$cm^2$ and an energy in the range of 10 KeV to 80 KeV to produce a boron or $BF_2$ concentration in the range of about $1\times10^{18}$ to $1\times10^{19}$ atoms/$cm^3$ and a junction depth in the range of 200 Å to 3000 Å Generally, a typical source/drain P+ ion implant process is a shallow implant and therefore utilizes an implantation of $BF_2$ ions rather than boron ions. Boron ions are very light ions and a very low energy must be used to provide a shallow boron ion implant. If too high an energy is used, the light ions are implanted at too great a depth. However, when the implanting energy is low, the beam current is also too low so that the time taken to perform the implant is excessive. $BF_2$ ions are larger and heavier ions so that a higher energy implant achieves a shallow depth.

The heavily-doped N-channel drain region 124 and the N-channel source region 128 are implanted by injecting arsenic atoms into a portion of the surface of the silicon wafer 100 that is self-aligned with the polysilicon gate 108 and the silicon nitride spacer 120 on the drain side and the source side of the N-channel transistor 110, respectively. The arsenic atoms are implanted at a dosage in the range of $1\times10^{15}$ to $5\times10^{15}$ atoms/$cm^2$ and an energy in the range of 2 to 50 keV to produce an arsenic concentration in the range of about $1\times10^{18}$ to $1\times10^{19}$ atoms/$cm^3$ and a junction depth in the range of 200 Å to 3000 Å

The junction depth of the P-channel drain region 122, the P-channel source region 126, the N-channel drain region 124, and the N-channel source region 128 is deeper than the depth of respective P-channel transistor LDD regions 118 and N-channel transistor LDD regions 116. The dopant concentration of the P-channel drain region 122 and the N-channel drain region 124 are sufficiently large to attain a conductive state of the respective P-channel polysilicon gate 104 and N-channel polysilicon gate 108 when connected to a suitably doped source.

The silicon wafer 100 is annealed to remove crystalline damage and activate and drive-in the implanted arsenic using a rapid thermal anneal process at a temperature in a range from 950° C. to 1050° C. for 10 to 60 seconds. The implanted boron or $BF_2$ in the silicon wafer 100 diffuses laterally and vertically, merging the P-channel drain region 122 with the P-channel transistor LDD region 118 in the vicinity of the P-channel drain region 122. The implanted arsenic in the silicon wafer 100 diffuses laterally and vertically to merge the N-channel drain region 124 with the N-channel transistor LDD regions 116 in the vicinity of the N-channel drain region 124.

Figure 2E:
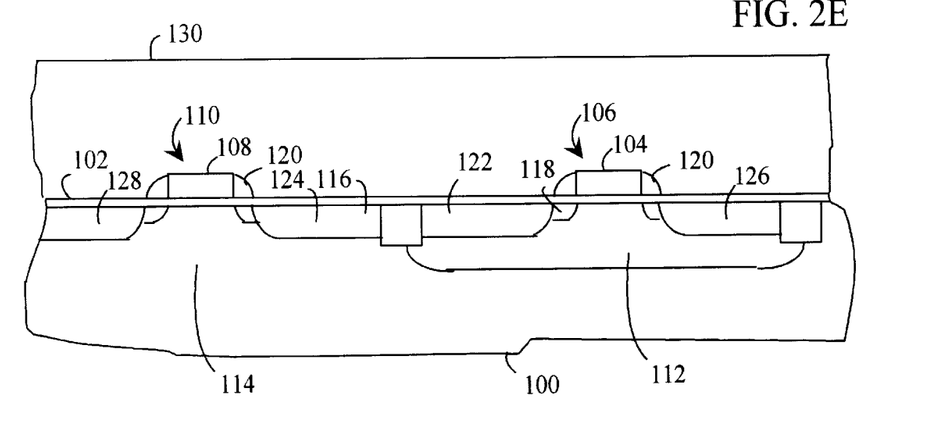

Referring to FIG. 2E, a blanket intralayer dielectric (ILD) layer of silicon dioxide ($SiO_2$) 130 is formed over the silicon wafer 100, covering the polysilicon gate 104 and spacers 120 of the P-channel transistor 106 and the polysilicon gate 108 and spacers 120 of the N-channel transistor 110. The ILD oxide layer 130 with a thickness in the range of 1000 Å to 25000 Å is conformally deposited over the silicon wafer 100 by chemical vapor deposition (CVD) at a temperature in the range of 300° C. to 400° C. The thick ILD layer of silicon dioxide 130 is planaized, for example by chemical-mechanical polishing or by reflow. The ILD layer of silicon dioxide 130 mutually isolates devices including the P-channel transistor 106 and the N-channel transistor 110 on the surface of the silicon wafer 100 and isolates devices from overlying conductive layers.

Figure 2F:
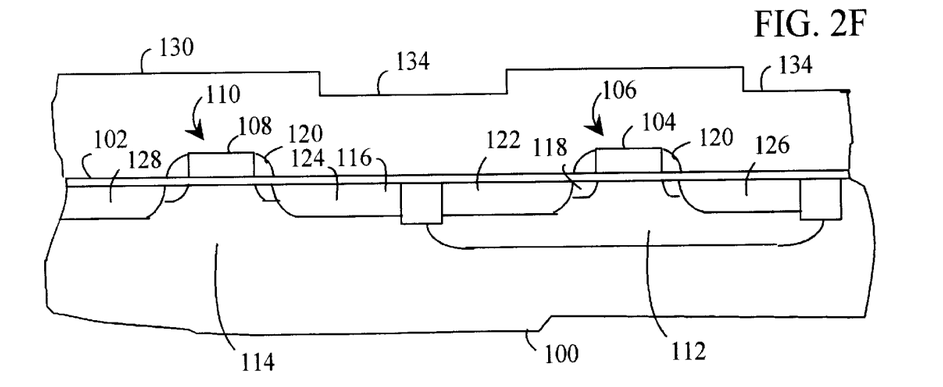

Referring to FIG. 2F, a photoresist trench mask (not shown) is patterned over the ILD layer of silicon dioxide 130. The photoresist trench mask is deposited in a continuous layer on the ILD layer of silicon dioxide 130 and irradiated using the photolithographic system to form a predefined two-dimensional image pattern on the horizontal planar surface of the ILD layer of silicon dioxide 130. The photoresist trench mask pattern defines a plurality of resistor trenches 134 for subsequent formation of polysilicon resistor structures in selected resistor regions. The photoresist trench mask is developed and irradiated portions of the mask are removed to expose the ILD layer of silicon dioxide 130 selected resistor regions. The ILD layer of silicon dioxide 130 is etched using a reactive ion etch (RIE) that etches the resistor trenches 134 a controlled depth into the ILD layer of silicon dioxide 130. Following formation of the resistor trenches 134, the photoresist trench mask is stripped.

The size and shape of the photoresist trench mask and the depth of the reactive ion etch (RIE) are defined so that the resistors that are formed in the trenches develop a selected resistance. The resistor trenches 134 form depression in the isolating ILD layer. The width, length, depth, and orientation of the resistor trenches 134 are precisely controlled by etching to supply a selected resistance.

Figure 2G:
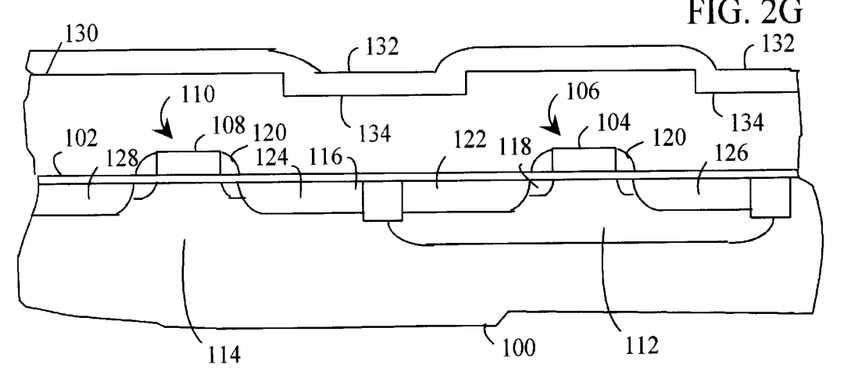

Referring to FIG. 2G, a blanket layer of polysilicon 132 is deposited over the silicon wafer 100, covering the oxide layer 130 including the regions of the resistor trenches 134. The polysilicon layer 132 is deposited by low pressure chemical vapor deposition (LPCVD) on the top surface of the oxide layer 130 to a thickness of approximately 2000 Å.

In some embodiments, the polysilicon is doped with either N-type dopants or P-type dopants to select the value of resistance. The second-layer polysilicon substrate is doped generally by either an implant operation or by doping during deposition. The polysilicon layer 132 is doped to form an electrical conductor. In one example, the polysilicon layer 132 is implanted with arsenic with a dosage in the range of $1 \times 10^{15}$ to $5 \times 10^{15}$ atoms/cm$^2$ and an energy in the range of 2 to 50 kiloelectron-volts. In some embodiments, the polysilicon layer 132 is heavily doped to supply an improved conductance. The polysilicon layer 132 is made conductive by annealing the silicon wafer 100 to activate and drive-in the dopant implanted in the polysilicon layer 132 using a rapid thermal anneal process at a temperature in a range from 950° C. to 1050° C. for 10 to 60 seconds. Advantageously, the dopant species and dosages are selected to precisely control the resistance values of the fabricated resistors rather than to comply with doping parameters for forming other devices in the manner of conventional transistor formation. As a result, the operating parameters for both the devices and resistors are improved and the range of resistances that are achieved is enlarged.

In other embodiments, the polysilicon is salicided directly to supply a desired resistance value. In these embodiments, a metal is deposited adjacent to the polysilicon layer 132 and reacts with the exposed silicon to form a silicide. The silicidation of the polysilicon layer 132 advantageously enhances the conductive properties of the polysilicon. The silicidation process in combination with an anneal process substantially enhances the conduction properties of the upper 200 Å of the polysificon layer 132. Prior to the silicidation process, the silicided polysilicon layer 132 is polished using a chemicalmechanical polishing process.

Figure 2H:
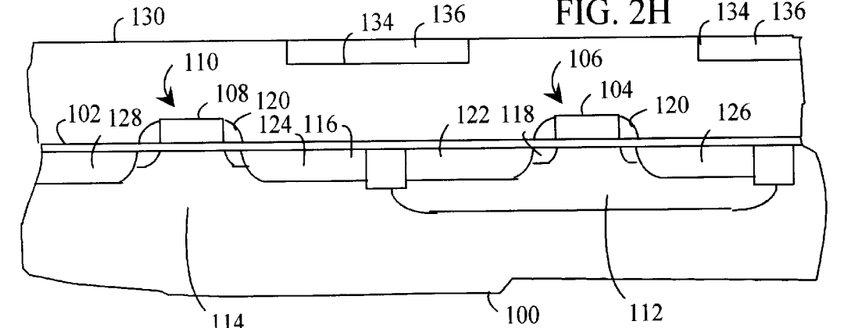

Referring to FIG. 2H, the polysilicon layer 132 overlying the ILD layer of silicon dioxide 130 and extending throughout the entire surface of the silicon wafer 100 is planarized using a chemical-mechanical polishing (CMP) process so that all that is left of the polished polysilicon layer 132 are polysilicon resistors 136 remaining in the resistor trenches 134. The polished polysilicon layer 132 is removed from all other surfaces of the ILD layer of silicon dioxide 130 by the CMP process. CMP creates a smooth, planar surface for intermediate processing steps of an integrated circuit fabrication process and removes undesirable residues that remain from other substrate processing steps. CMP involves simultaneous chemically etching and mechanical polishing or grinding of a surface so that a combined chemical reaction and mechanical polishing removes a desired material from the substrate surface in a controlled manner. The resulting structure is a planarized substrate surface with any protruding surface topography leveled. CMP is typically performed by polishing a substrate surface against a polishing pad that is wetted with a slurry including an acidic or basic solution, an abrasive agent and a suspension fluid. The chemical-mechanical polishing process is highly advantageous for forming a highly planar structure that is beneficial in integrated circuits having multiple metal layers. The planarized polysilicon forms a second-layer substrate formation, an essentially planar resistor structure that is elevated from the transistor layer of the integrated circuit.

Figure 2I:
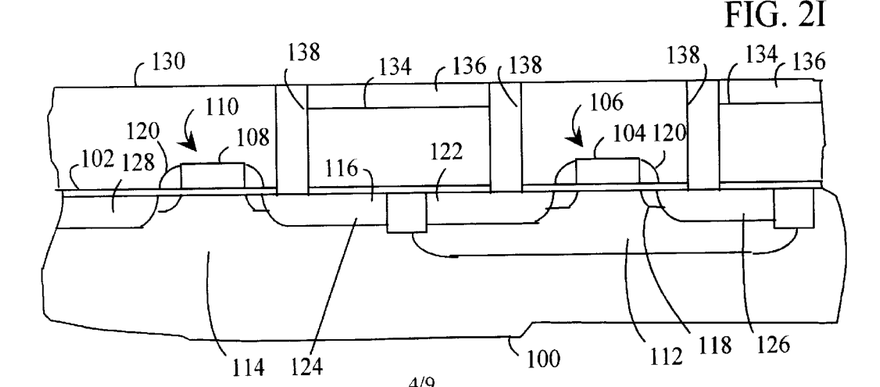

Referring to FIG. 2I, an interconnect layer contact mask is patterned overlying the ILD layer of silicon dioxide 130 and the polysilicon resistors 136. The interconnect layer contact mask is deposited in a continuous layer on the ILD layer of silicon dioxide 130 and polysilicon resistors 136 and is irradiated using a photolithographic system to form a predefined two-dimensional image pattern on the outermost horizontal planar surface overlying the silicon wafer 100. The interconnect layer contact mask defines a plurality of contact vias 138 for accessing the surface of the silicon wafer 100 adjacent to selected device source or drain regions such as the P-channel source region 126 and the N-channel source region 128 through the ILD layer of silicon dioxide 130. The interconnect layer contact mask is developed and irradiated portions of the mask are removed to expose the ILD layer of silicon dioxide 130 overlying the prospective locations of the contact vias 138. The ILD layer of silicon dioxide 130 is etched using a reactive ion etch (RIE) that etches the contact vias 138 through the ILD layer of silicon dioxide 130 and through the gate oxide layer 102 to the surface of the silicon wafer 100. A interconnect layer contact mask is patterned and etched to form vias that expose source and drain regions of the transistors on the surface of the substrate for connection using a local interconnect.

The illustrative example shows a contact via 138 adjacent to the polysilicon resistor 136 structures of the second-layer polysilicon and extending to the source and drain regions of devices on the surface of the silicon wafer 100. Accordingly, in the illustrative example, the contact vias 138 form connections to transistors on the surface of the substrate and to resistor. In the illustrative example, the polysilicon resistor 136 is connected between the N-channel transistor 110 and the P-channel transistor 106.

Following formation of the contact vias 138, the interconnect layer contact mask is stripped, exposing the device contact regions, such as the P-channel source region 126 and N-channel source region 128 of the silicon wafer 100.

In some embodiments, silicidation is performed on the etched portions of the polysilicon resistors 136 adjacent to the contact vias 138 so that a strong silicide is formed not only on the top of the polysilicon resistors 136 but at the intersection of the polysilicon resistors 136 along the contact vias 138, substantially enhancing the conduction properties of the 200 Å of the polysilicon resistors 136 bounding the contact vias 138.

Figure 2J:
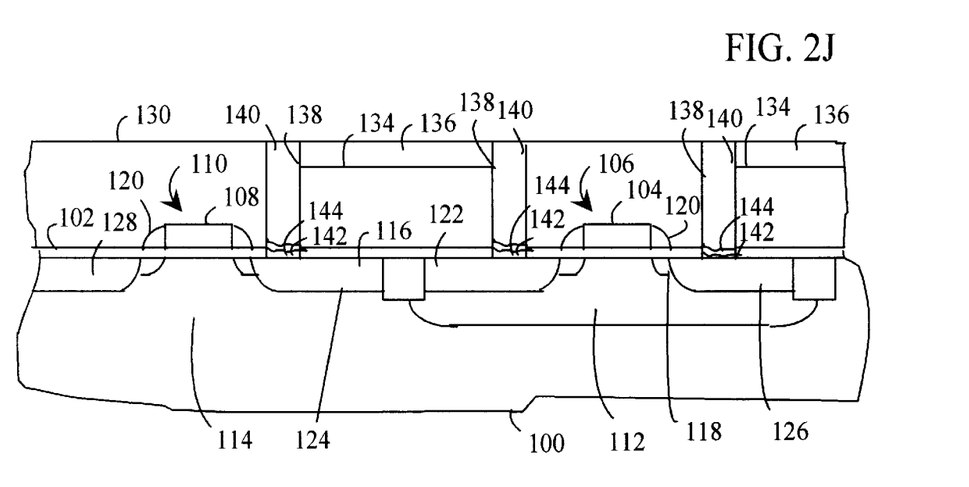

Referring to FIG. 2J, metal plugs 140 are formed to supply a local electrical interconnection, in some cases electrically and selectively interconnecting multiple transistors, devices, and resistors. Typically a layer of metal is deposited overlying the entire surface of the silicon wafer 100 to form a local interconnect of metal plugs 140. The metal plugs 140 are filled into the contact vias 138 to form source and drain connections to the transistors and connecting the transistors to the resistors on the second-layer polysilicon.

In some embodiments, the metal plugs 140 are formed by first depositing a titanium sacrificial barrier 142 into the contact vias 138 in contact with the source/drain regions of the silicon wafer 100. Titanium films are used as a diffusion barrier since titanium (Ti) is an oxygen-gettering material and oxide-reducing agent. Accordingly, titanium dissolves a native oxide layer on the silicon surface of the silicon wafer 100 during annealing and adheres well to both silicon and oxide ($SiO_2$). In addition, titanium forms good ohmic contacts to heavily-doped silicon whether the doping is N-type doping or P-type doping.

The illustrative structure advantageously facilitates circuit arrangements in which the sources of two or more transistors are connected.

In the illustrative embodiment, the metal plugs 140 form a tungsten (W) interconnect. The titanium sacrificial barrier 142 between the polysilicon of the source regions of the silicon wafer 100 and the tungsten metal plugs 140 functions as a sacrificial barrier through the reaction of titanium with tungsten to form a titanium-tungsten alloy. The titanium sacrificial barrier 142 is formed by depositing a very thin layer of titanium onto the silicon wafer 100 including deposition into the contact vias 138. The silicon wafer 100 is annealed to react the titanium with the silicon in the undoped polysilicon, thereby forming $TiSi_2$. The titanium is deposited as a very thin layer to avoid absorption of dopants from the undoped polysilicon during formation of $TiSi_2$.

Following the formation of the titanium sacrificial barrier 142, a titanium nitride (TiN) passive barrier 144 is formed over the titanium sacrificial barrier 142. The TiN passive barrier 144 serves as a contact diffusion barrier in silicon integrated circuits by operating as an impermeable barrier to silicon and by virtue of a high activation energy for the diffusion of other impurities. TiN has a high thermodynamic stability and a relatively low electrical resistivity of transition metal carbides, borides or nitrides. The TiN passive barrier 144 is formed using one of multiple techniques. For example, the TiN passive barrier 144 is formed by: (1) evaporating titanium in a nitrogen ($N_2$) ambient, (2) reactively sputtering the titanium in an argon (Ar)—nitrogen ($N_2$) mixture, (3) sputtering from a TiN target in an inert argon ambient, (4) sputter depositing titanium in an argon (Ar) ambient and converting the titanium to TiN is a separate plasma nitridation step, or (5) chemical vapor deposition (CVD).

The tungsten metal plugs 140 are formed by chemical vapor deposition (CVD) of tungsten in a low pressure CVD reactor. Typically tungsten tetrafluoride $WF_6$ is used as a source gas for reduction by hydrogen or silicon in a two-step process. In a first step, the tungsten source is reduced by silicon to form a layer of tungsten approximately 100 Å thick. In a second step, hydrogen $H_2$ reduction is performed to deposit additional tungsten only on the tungsten layer formed in the first step. The metal plugs 140 are formed in the source vias 134 over the titanium sacrificial barrier 142 and the TiN passive barrier 144 by silicon reduction of tungsten tetrafluoride $WF_6$, leaving solid tungsten and silicon fluoride vapor.

Once the metal plugs 140 are formed, excess metal is removed, typically either by metal polishing or etching. In some embodiments of a fabrication process, the metal layer is polished using a chemical-mechanical polishing technique to a level substantially even with the surface of the ILD layer of silicon dioxide 130 and the polysilicon resistors 136 of the second-layer polysilicon substrate. In other embodiments, the metal local interconnect layer is etched to localize metal plugs and lines to selected areas and configurations.

The metal plugs 140 may be formed of metals other than tungsten. Metal plugs are most commonly constructed from titanium (Ti), tungsten (W), titanium nitride (TiN), aluminum (Al), or other common metals. Tungsten advantageously tolerates high temperatures that occur during annealing.

Figure 3A:
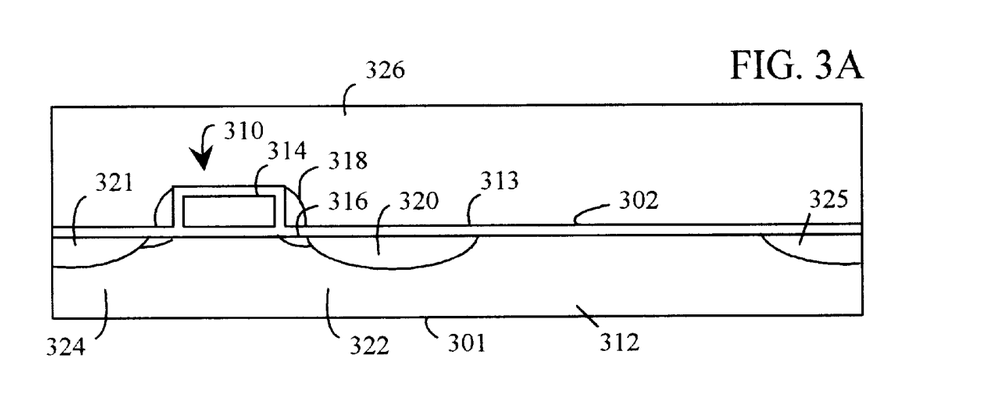
FIGS. 3A through 3C depict a sequence of schematic cross-sectional views that portray a summary of a fabrication process embodiment for forming an integrated circuit including a polysilicon thin-film resistor and a polysilicon local interconnect structure.
Figure 3B:
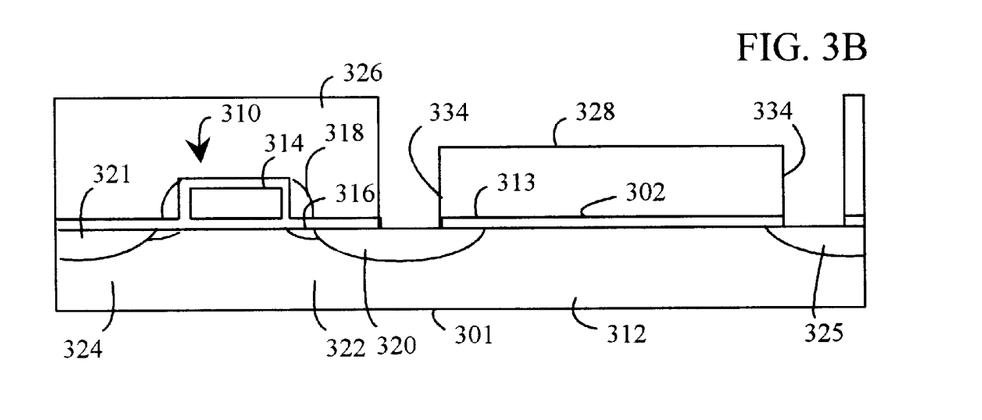
Figure 3C:
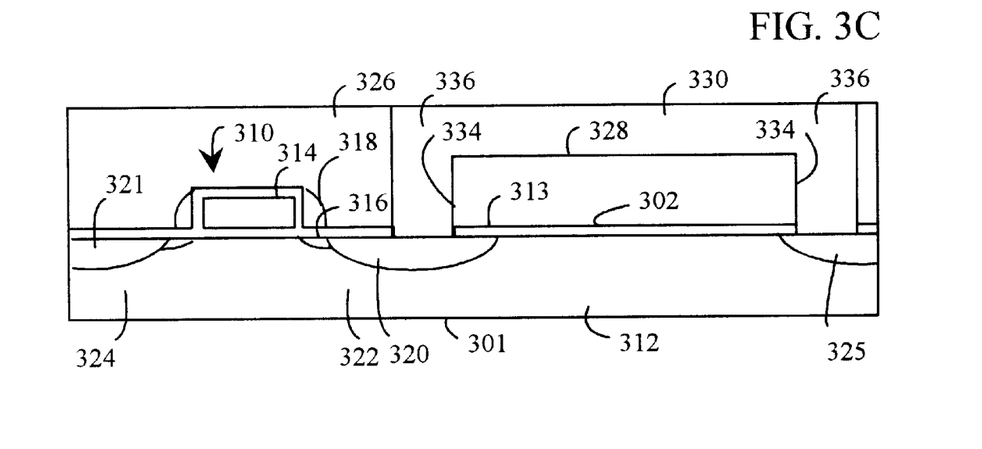

Referring to FIGS. 3A through 3C, a sequence of schematic cross-sectional views illustrate a summary of a fabrication process embodiment for forming an integrated circuit including a polysilicon thin-film resistor and a polysilicon local interconnect structure. In this embodiment, a trench etch is performed followed by a contact etch without an intervening deposition of resistor polysilicon. Following trench etch and contact etch, both the contact vias and resistor trench are filled with polysilicon, typically doping the polysilicon during deposition. FIG. 3A shows a portion of a semiconductor wafer 301 with a cross-sectional view of a MOSFET 310 formed on a transistor layer 302 of a substrate 312. The MOSFET 310 includes a gate oxide layer 313 overlying the substrate 312, a polysilicon gate 314, and LDD regions 316 self-aligned with the polysilicon gate 314. Spacers 318 are formed lateral to the polysilicon gate 314. The MOSFET 310 includes a heavily-doped drain implant 320 implanted on a drain side 22 and a heavily-doped source implant 321 on a source side 324 of the MOSFET 310. A thick intralayer dielectric (ILD) layer of silicon dioxide 326 (1000 Å to 25000 Å) is deposited over the substrate 312 and the polysilicon gate 314 and spacers 318 to electrically isolate devices formed on the substrate 312.

A heavily-doped region 325 of a device in the vicinity of the MOSFET 310 is also implanted in the substrate 312.

Referring to FIG. 3B, a cross-sectional view of the semiconductor wafer 301 illustrates the structure of the ILD layer of silicon dioxide 326 following a trench etch and contact etch without an intervening deposition of resistor polysilicon. A patterned trench 328 is formed in the ILD layer of silicon dioxide 326 by depositing a photoresist trench mask pattern (not shown) overlying the ILD layer of silicon dioxide 326. The size, shape and configuration of the photoresist trench mask pattern in defined to attain a selected resistance for each resistor structure that is subsequently fabricated in the ILD layer of silicon dioxide 326. The photoresist trench mask pattern is formed, the ILD layer of silicon dioxide 326 is etched, and the photoresist trench mask pattern is stripped, leaving the patterned trench 328 as a formed depression in the ILD layer of silicon dioxide 326.

Following formation of the patterned trench 328, a contact via 334 is formed through the ILD layer of silicon dioxide 326 directly adjacent to the patterned trench 328 and extending through the ILD layer of silicon dioxide 326 to suitable source/drain regions of devices on the surface of the substrate 312. For example, the contact via 334 is shown passing through the ILD layer of silicon dioxide 326 and through the gate oxide layer 313 to form an ohmic connection to the source implant 321. A contact via 334 is also formed to the heavily-doped region 325 of a nearby device. The contact via 334 is formed using a contact mask (not shown) which is patterned and etched to form the contact via 334. Vias are formed to expose source and drain regions of the transistors and devices on the surface of the substrate 312. The contact via 334 intersects the polysilicon resistor 330 structure of the second-layer substrate formation 332. A contact via 334 is also formed.

Referring to FIG. 3C, following the trench etch and contact etch, both the contact vias and resistor trench are filled with polysilicon, typically doping the polysilicon during deposition. A polysilicon resistor 330 and polysilicon local interconnect plugs 336 are formed within the patterned trench 328 and contact vias 334 by depositing a polysilicon layer (not shown) over the entire surface of the semiconductor wafer 301 and planarizing the polysilicon by a chemical-mechanical polishing (CMP) process so that the polysilicon is removed in regions other than the patterned trench 328 and contact vias 334. Typically, the polysilicon resistor 330 and polysilicon local interconnect plugs 336 are doped with either N-type dopants or P-type dopants to select a resistance level. Typically the polysilicon is doped by either an implant operation or by doping during deposition.

Figure 4:
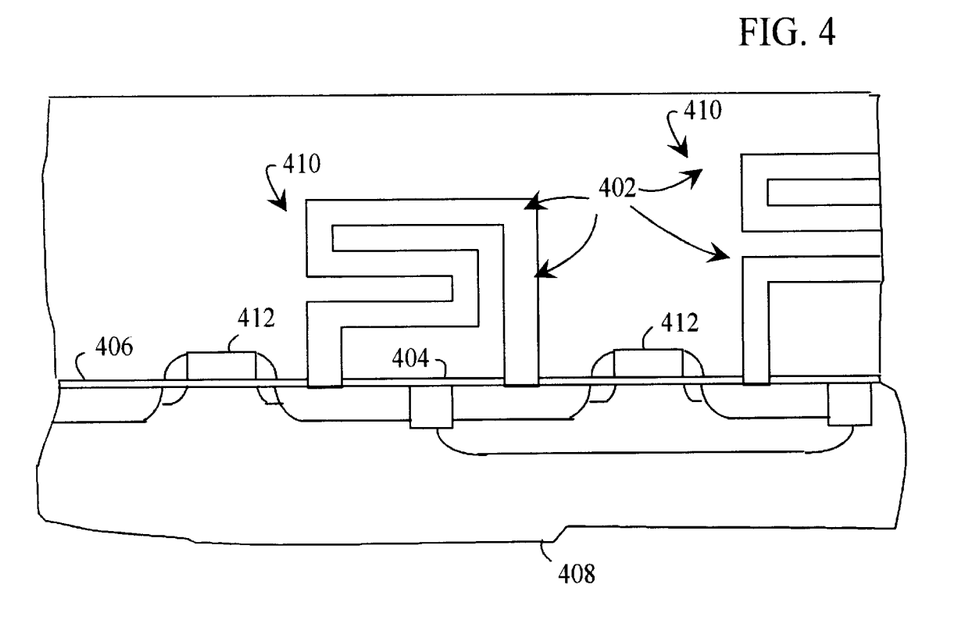
FIG. 4 is a schematic cross-sectional semiconductor wafer view showing an embodiment of an integrated circuit including a multiple-layered resistors fabricated at a plurality of substrate levels elevated above a transistor level.

Referring to FIG. 4, an alternative embodiment of an integrated circuit includes multiple resistive layers 402 fabricated at a plurality of substrate levels elevated above a transistor level 404 at a surface 406 of a substrate wafer 408. The multiple-layered resistor 410 advantageously supports formation of resistors in multiple dimensions to attain a variety of resistance values for connecting devices such as a transistor 412.

Figure 5A:
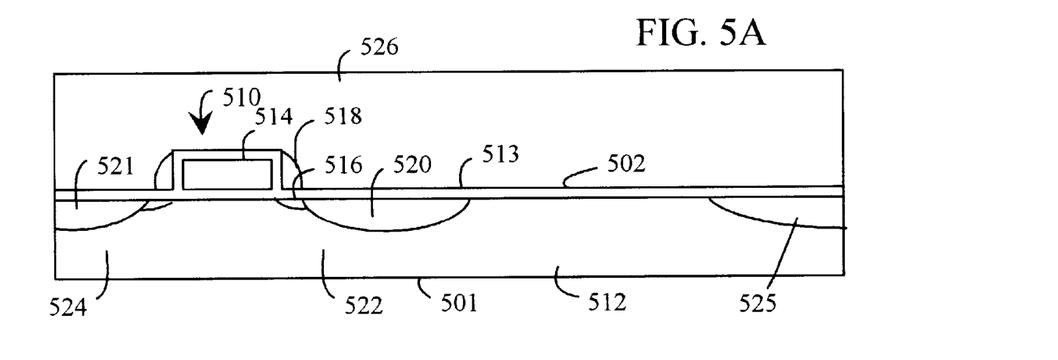
FIGS. 5A through 5C depict a sequence of schematic cross-sectional views illustrating fabrication of an integrated circuit including a metal plug local interconnect structure and a polysilicon thin-film resistor formed on an intralayer dielectric (ILD) surface without etching a trench.
Figure 5B:
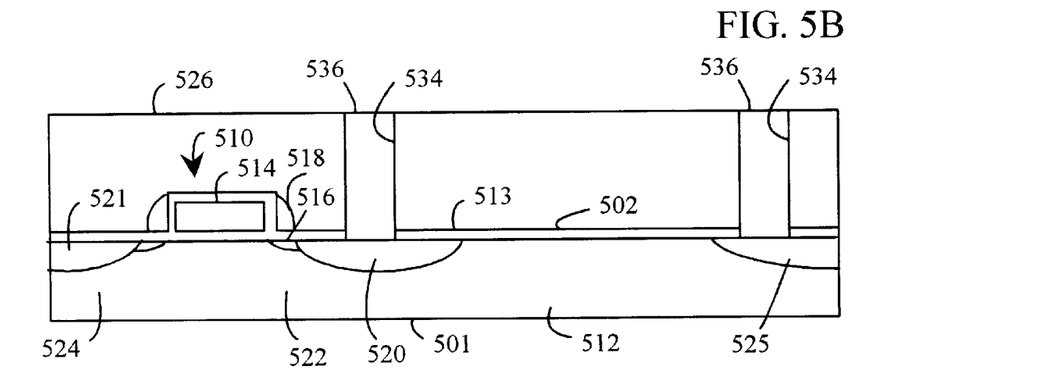
Figure 5C:
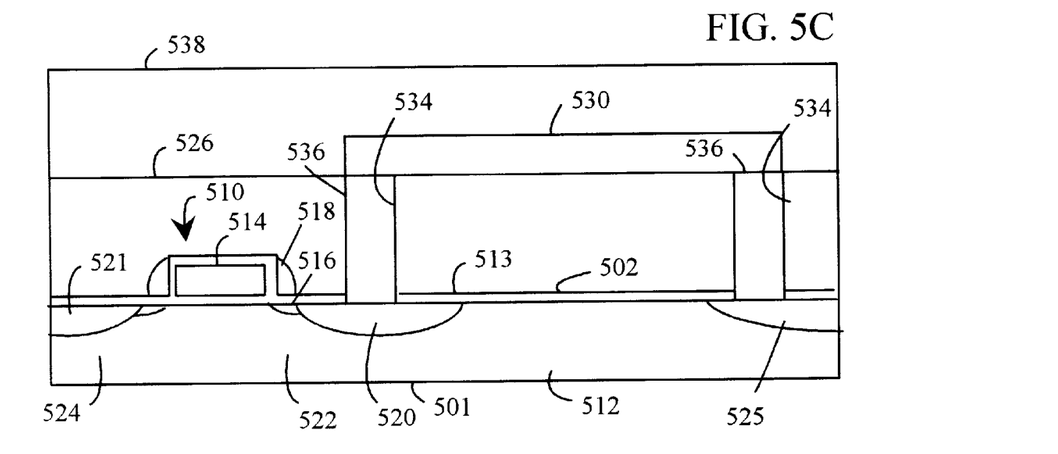

Referring to FIGS. 5A through SC, a sequence of schematic cross-sectional views illustrate a summary of an alternative fabrication process embodiment for forming an integrated circuit including a polysilicon thin-film resistor and a metal plug local interconnect structure. In this embodiment, a polysilicon resistor is formed on an intralayer dielectric (ILD) surface without etching a trench. FIG. 5A shows a portion of a semiconductor wafer 501 with a cross-sectional view of a MOSFET 510 formed on a transistor layer 502 of a substrate 512. The MOSFET 510 includes a gate oxide layer 513 overlying the substrate 512, a polysilicon gate 514, and LDD regions 516 self-aligned with the polysilicon gate 514. Spacers 518 are formed lateral to the polysilicon gate 514. The MOSFET 510 includes a heavily-doped drain implant 520 implanted on a drain side 522 and a heavily-doped source implant 521 on a source side 524 of the MOSFET 510. The MOSFET 510 also includes spacers 518 to electrically isolate devices formed on the substrate 512. An intralayer dielectric (ILD) layer of silicon dioxide 526 is deposited over the substrate 512 and the polysilicon gate 514 to a thickness in a range from approximately 5000 Å to about 10000 Å, a thickness substantially less than the thickness of the 1000 Å to 25000 Å thickness for forming polysilicon resistors in a trench structure. The intralayer dielectric (ILD) layer of silicon dioxide 526 is thickness is reduced since resistor structures are formed overlying the intralayer dielectric (ILD) layer of silicon dioxide 526 and are not formed in a trench etched into the intralayer dielectric (ILD) layer of silicon dioxide 526. The intralayer dielectric (ILD) layer of silicon dioxide 526 is planarized, for example by chemical-mechanical polishing or by reflow.

Referring to FIG. 5B, a schematic cross-sectional view of the silicon wafer 501 shows a contact via 534 is formed through the ILD layer of silicon dioxide 526 extending through the ILD layer of silicon dioxide 526 to suitable source/drain regions of devices on the surface of the substrate 512.

A contact process is used to form contact vias 534 that are patterned and etched to cut holes making electrical connections to the source and drain regions of the transistors. The positioning of the contact vias 534 defines locations for depositing metal for making local interconnects. For example, the contact via 534 is shown passing through the ILD layer of silicon dioxide 526 and through the gate oxide layer 513 to form an ohmic connection to the source implant 521. The contact via 534 is formed using a contact mask (not shown) which is patterned and etched to form the contact via 534. Vias are formed to expose source and drain regions of the transistors and devices on the surface of the substrate 512.

A metal plug 536 is formed inside the contact via 534 to serve as a local interconnect structure, for example forming an electrical connection to the MOSFET 510. A selected metal is deposited over the entire surface of the silicon wafer 501 to form the metal plugs 536 filling into the contact vias 534 and forming local interconnect structures. Metal plugs are typically constructed from titanium (Ti), tungsten (W), titanium nitride (TiN), aluminum (Al), or other common metals. Metal interconnect lines and metal plugs forming local interconnect structures are etched to interconnect transistors in a desired and predefined configuration. However, a local interconnect structure using only metal interconnections does not permit suitable formation of resistors since the conductance of metal is too high. Therefore, resistive interconnections between transistors are left disconnected in the metal etch process. The metal plugs and metal lines are planarized to form a substantially level plug structure.

Referring to FIG. 5C, a polysilicon resistor 530 is formed by depositing a polysilicon layer (not shown) over the entire surface of the semiconductor wafer 501 overlying the intralayer dielectric (ILD) layer of silicon dioxide 526 and the metal plugs 536. The polysilicon layer may be doped with N-type dopants or P-type dopants to select the value of resistance. Typically the second-layer substrate formation 32 is doped by either an implant operation or by doping during deposition using a dopant species and dosages that are selected to control the resistance values of the fabricated resistors. The polysilicon layer is annealed and then planarized.

The polysilicon layer is patterned and etched using the resistor etch mask to form polysilicon resistor structures including the polysilicon resistor 530 overlying the ILD layer and metal plugs. The polysilicon resistor layer is etched to selectively extend between and overlying designated metal plugs, making a conductive local interconnect contact to the metal plugs. The size, shape and configuration of the resistor etch mask pattern in defined to attain a selected resistance for each resistor structure. The resistor etch mask pattern is formed, the polysilicon layer is etched, and the resistor etch mask is stripped, leaving the polysilicon resistor 530 overlying the ILD layer of silicon dioxide 526. The width, length, depth, and orientation of the polysilicon resistor 530 are precisely controlled by controlling the pattern shape, size and configuration and by controlling the thickness of the deposited polysilicon to fabricate resistors with a precisely controlled resistance.

The polysilicon resistor 530 are formed in resistor-like lines or rectangular cross-sectional areas that are to be connected with underlying metal plugs 536. Advantageously, a small layer of titanium or titanium nitride deposited on the wafer forms a salicide with the polysilicon and attains an improved electrical connection.

An additional intralayer dielectric (ILD) oxide 538 is deposited overlying the first intralayer dielectric (ILD) layer of silicon dioxide 526 and extending essentially to the level of the polysilicon resistor layer, laterally isolating the polysilicon resistor 530.

Figure 6:
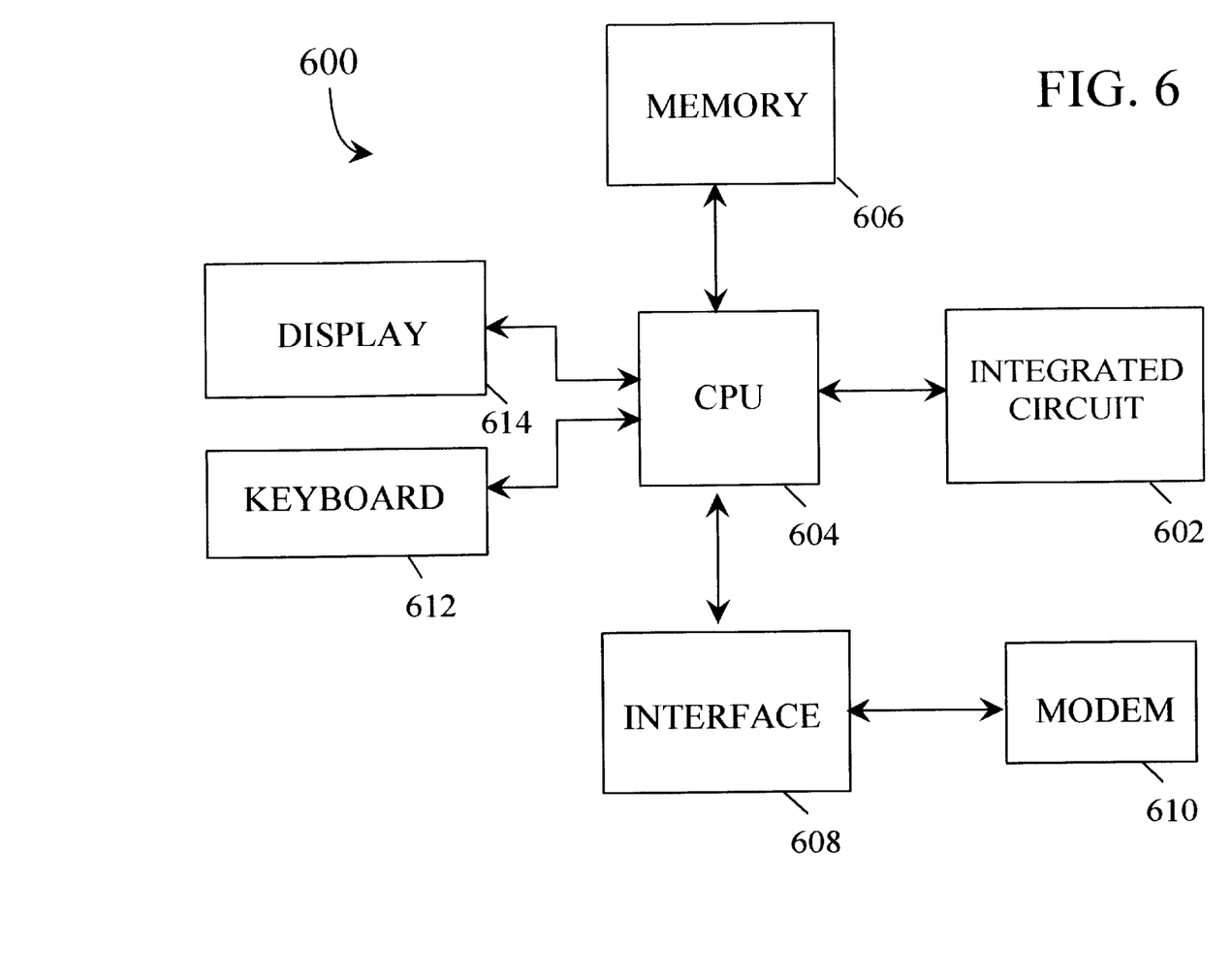
FIG. 6 is a schematic block diagram illustrating a computer system including an integrated circuit including a thin-film resistor fabricated using a method depicted in FIGS. 1A through 1C, FIGS. 2A through 2J, FIGS. 3A through 3C, and FIGS. 5A through 5C.

Referring to FIG. 6, a computer system 600 includes an integrated circuit 602, a central processing unit 604, a memory 606, and an interface 608, connected to a modem 610. The computer system 600 also includes a keyboard 612 and a display 614 forming a user interface.

While the invention has been described with reference to various embodiments, it will be understood that these embodiments are illustrative and that the scope of the invention is not limited to them. Many variations, modifications, additions and improvements of the embodiments described are possible. For example, those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. An integrated circuit chip including an integrated circuit formed using a method of fabricating an integrated circuit comprising:

forming a transistor including a gate formed on a substrate over a gate oxide layer and a source region and a drain region doped into the substrate self-aligned with respect to the gate, the transistor being formed on the substrate to define a transistor plane;

forming an intralayer dielectric (ILD) layer overlying the substrate and the transistor;

etching a resistor trench into the ILD layer;

controlling the width, length, depth, and orientation of etching of the resistor trench to attain a predetermined resistance of a resistor to be subsequently formed within the resistor trench;

forming a polysilicon resistor in the resistor trench, the polysilicon resistor being formed on a resistor plane which is elevated with respect to the transistor plane and etched into the ILD layer;

cutting a via through the ILD layer abutting the polysilicon resistor in the resistor trench and through the gate oxide layer to the substrate surface at the source region or the drain region of the transistor, the via being bounded by lateral sides including a lateral side abutting the polysilicon resistor and by a bottom extending to the substrate surface and forming a conductive plug in the via, the conductive plug electrically coupling to the source region or the drain region of the transistor and electrically coupling to the polysilicon resistor on the lateral side of the via abutting the polysilicon resistor.

2. An integrated circuit chip including an integrated circuit formed using a method of fabricating an integrated circuit according to claim 1, further comprising:

controlling the resistance of the polysilicon resistor including:

controlling the width, length, thickness, and orientation of the polysilicon resistor;

doping the polysilicon resistor; and selecting the dopant species and doping amounts to control the resistance of the polysilicon resistor.

3. An integrated circuit chip including an integrated circuit formed using a method of fabricating an integrated circuit according to claim 2, further comprising:

controlling the resistance of the polysilicon resistor including:

siliciding the surface of the polysilicon resistor to increase the conductance and reduce the resistance of the polysilicon resistor.

4. An electronic system including a microprocessor, a memory, a system bus and an integrated circuit fabricated using a method of fabricating an integrated circuit comprising:

forming a transistor including a gate formed on a substrate over a gate oxide layer and a source region and a drain region doped into the substrate self-aligned with respect to the gate, the transistor being formed on the substrate to define a transistor plane;

forming an intralayer dielectric (ILD) layer overlying the substrate and the transistor;

etching a resistor trench into the ILD layer;

controlling the width, length, depth, and orientation of etching of the resistor trench to attain a predetermined resistance of a resistor to be subsequently formed within the resistor trench;

forming a polysilicon resistor in the resistor trench, the polysilicon resistor being formed on a resistor plane which is elevated with respect to the transistor plane and etched into the ILD layer;

cutting a via through the ILD layer abutting the polysilicon resistor in the resistor trench and through the gate oxide layer to the substrate surface at the source region or the drain region of the transistor, the via being bounded by lateral sides including a lateral side abutting the polysilicon resistor and by a bottom extending to the substrate surface and forming a conductive plug in the via, the conductive plug electrically coupling to the source region or the drain region of the transistor and electrically coupling to the polysilicon resistor on the lateral side of the via abutting the polysilicon resistor.

5. An electronic system including a microprocessor, a memory, a system bus and an integrated circuit fabricated using a method of fabricating an integrated circuit according to claim 4, comprising:

controlling the resistance of the polysilicon resistor including:

controlling the width, length, thickness, and orientation of the polysilicon resistor;

doping the polysilicon resistor; and selecting the dopant species and doping amounts to control the resistance of the polysilicon resistor.

6. An electronic system including a microprocessor, a memory, a system bus and an integrated circuit fabricated using a method of fabricating an integrated circuit according to claim 4, comprising:

controlling the resistance of the polysilicon resistor including:

siliciding the surface of the polysilicon resistor to increase the conductance and reduce the resistance of the polysilicon resistor.

7. An integrated circuit comprising:

a substrate wafer;

a transistor formed upon and within a portion of the substrate wafer, the transistor including a gate formed on the substrate over a gate oxide layer and a source region and a drain region doped into the substrate self-aligned with respect to the gate, the transistor being formed on the substrate to define a transistor plane;

an insulating layer coupled to and overlying the substrate and the transistor, the insulating layer having a resistor trench etched into a surface of the insulating layer, the resistor trench having controlled width, length, depth, and orientation to supply a selected resistance;

a thin film resistor formed within the resistor trench and coupled to at least a portion of the insulating layer;

a via passing through the layer insulating abutting the thin film resistor in the resistor trench and through the gate oxide layer to the substrate 817 surface and coupled to the source region or the drain region of the transistor, the via being bounded by lateral sides including a lateral side abutting the thin film resistor and by a bottom extending to the substrate wafer and a conductive plug contained within the via, the conductive plug electrically coupling to the source region or the drain region of the transistor and electrically coupling to the thin film resistor on the lateral side of the via abutting the thin film resistor.

8. An integrated circuit comprising:

a substrate wafer;

a transistor formed upon and within a portion of the substrate wafer, the transistor including a gate formed on the substrate over a gate oxide layer and a source region and a drain region doped into the substrate self-aligned with respect to the gate, the transistor being formed on the substrate to define a transistor plane;

an intralayer dielectric (ILD) layer coupled to and overlying the substrate and the transistor, the ILD layer having a resistor trench etched into a surface of the ILD layer, the resistor trench having controlled width, length, depth, and orientation to supply a selected resistance;

a polysilicon resistor formed within the resistor trench and coupled to at least a portion of the ILD layer;

a via passing through the ILD layer abutting the polysilicon resistor in the resistor trench and through the gate oxide layer to the substrate surface and coupled to the source region or the drain region of the transistor, the via being bounded by lateral sides including a lateral side abutting the polysilicon resistor and by a bottom extending to the substrate surface and a conductive plug contained within the via, the conductive plug electrically coupling to the source region or the drain region of the transistor and electrically coupling to the polysilicon resistor on the later side of the via abutting the polysilicon resistor.

9. An integrated circuit according to claim 8, wherein: the polysilicon resistor includes N-type or P-type dopants that are doped at selected concentrations to control resistance.

10. An integrated circuit according to claim 8, wherein: the polysilicon resistor includes dopants distributed at deposition at selected concentrations to control resistance.

11. An integrated circuit according to claim 8, wherein: the polysilicon resistor includes implanted dopants that increase the conductance and reduce the resistance of the polysilicon resistor.

12. An integrated circuit according to claim 8, further comprising:

a silicide layer reacted onto the polysilicon resistor that increases the conductance and reduces the resistance of the polysilicon resistor.

13. An integrated circuit according to claim 8, wherein: the polysilicon resistor has a controlled width, length, thickness, and orientation and has dopant species and doping amounts controlled to determine the resistance of the polysilicon resistor.

14. An integrated circuit according to claim 8, wherein: the conductive plug in the via is a metal plug.

15. An integrated circuit according to claim 8, wherein: the conductive plug in the via is a metal plug, the metal being selected from titanium (Ti), tungsten (W), titanium nitride (TiN), and aluminum (Al).

16. An integrated circuit according to claim 8, wherein: the conductive plug in the via is a polysilicon plug.

17. An electronic system including a microprocessor, a memory, a system bus and an integrated circuit according to claim 8.

18. An electronic system including a microprocessor, a memory, a system bus and an integrated circuit according to claim 8.

19. An integrated circuit according to claim 8 further comprising:

a plurality of transistors, ones of the plurality of transistors being formed upon and within a portion of the substrate wafer, ones of the transistors including a gate formed on the substrate over a gate oxide layer and a source region and a drain region doped into the substrate self-aligned with respect to the gate, ones of the transistor being formed on the substrate in the transistor plane, wherein:

the ILD layer extends across the plurality of transistors to mutually isolate ones of the plurality of transistors, and the ILD layer and gate oxide layer include a plurality of vias extending to selected source regions and drain regions of selected ones of the plurality of transistors, the integrated circuit further including:

a polysilicon resistor formed laterally between two of the plurality of transistors; and two conductive plugs coupling the polysilicon resistor between the two of the plurality of transistors.

* * * * *